(12) United States Patent
Hwang et al.

(10) Patent No.: US 7,068,102 B2
(45) Date of Patent: Jun. 27, 2006

(54) POWER AMPLIFYING APPARATUS AND METHOD USING PRE-DISTORTION AND RADIO COMMUNICATION SYSTEM INCLUDING THE SAME APPARATUS

(75) Inventors: Vincent Inkyou Hwang, Fremont, CA (US); Yongsub Kim, Anyang (KR); Chen Liu, Fremont, CA (US)

(73) Assignee: DANAM Inc., Kyunggi-Do (KR)

( * ) Notice: Subject to any disclaimer, the term of this patent is extended or adjusted under 35 U.S.C. 154(b) by 0 days.

(21) Appl. No.: 10/884,835

(22) Filed: Jul. 2, 2004

(65) Prior Publication Data

US 2005/0007193 A1 Jan. 13, 2005

(30) Foreign Application Priority Data

Jul. 10, 2003 (KR) .................. 10-2003-0046653

(51) Int. Cl.
*H03F 1/26* (2006.01)
(52) U.S. Cl. .................................... 330/149
(58) Field of Classification Search .......... 330/2; 375/297
See application file for complete search history.

(56) References Cited

U.S. PATENT DOCUMENTS

| | | | |
|---|---|---|---|
| 6,600,792 B1 * | 7/2003 | Antonio et al. | 375/297 |
| 6,903,604 B1 * | 6/2005 | Kim | 330/2 |
| 2003/0063686 A1 * | 4/2003 | Giardina et al. | 375/296 |
| 2005/0111575 A1 * | 5/2005 | Taler et al. | 375/297 |
| 2005/0116775 A1 * | 6/2005 | McBeath et al. | 330/149 |
| 2005/0157813 A1 * | 7/2005 | Cope et al. | 375/297 |

\* cited by examiner

*Primary Examiner*—Steven J. Mottola
(74) *Attorney, Agent, or Firm*—GWiPs

(57) ABSTRACT

A new concept of power amplifying apparatus and method is developed for adopting pre-distortion and applying to a radio communication system. The power amplifying apparatus includes a pre-distortion module for pre-distorting an input signal x(n) according to a pre-distortion function, and for outputting a pre-distorted signal z(n), a power amplifier for amplifying a signal obtained by digital-to-analog conversion of the pre-distorted signal z(n), a pre-distortion function producing module for receiving the pre-distorted signal z(n) and a signal y(n) obtained by analog-to-digital conversion of the fed-back output signal of the power amplifier, and for obtaining model coefficients $c_{q,k,s}$ that minimize the power of a modeling error signal e(n)=z(n)−y(n). The pre-distortion function used by the pre-distortion module is represented as $$z(n) = \sum_{q=0}^{Q} \sum_{k=1}^{K} \sum_{s=-S}^{\min(S,q)} c_{q,k,s} y(n-q+s)|y(n-q)|^{k-1}.$$

6 Claims, 3 Drawing Sheets

POWER AMPLIFYING APPARATUS AND METHOD USING PRE-DISTORTION AND RADIO COMMUNICATION SYSTEM INCLUDING THE SAME APPARATUS

BACKGROUND OF THE INVENTION

1. Field of the Invention

The present invention relates to a power amplifying apparatus and method using pre-distortion and a radio communication system including the same power amplifying apparatus.

2. Related Prior Art

To design a power amplifier it is required to consider both the signal distortion characteristic and the amplification factor because the two factors are inconsistent with each other. For example, an A-grade amplifier barely has signal distortion while having a low amplification factor. The C-grade amplifier has severe signal distortion while having a high amplification factor.

Recently, a variety of attempts to increase the amplification factor without causing signal distortion have been made. Pre-distortion is a typical method for increasing the amplification factor. The pre-distortion method intentionally distorts a signal input to a power amplifier before the signal is applied to the power amplifier to compensate for the nonlinear characteristic of the power amplifier. The pre-distortion method distorts the input signal according to a pre-distortion function to achieve linearization, thus satisfying high efficiency and low distortion characteristics. The pre-distortion function has a characteristic opposite to the characteristic function of the power amplifier.

FIG. 1 is a block diagram of a conventional typical pre-distortion system. Referring to FIG. 1, a digital baseband input signal $U_n$ is inputted to a pre-distortion module 20 and pre-distorted according to a pre-distortion function $A(.)$ to be outputted as $X_n$. The signal $X_n$ is converted to an analog signal by a D/A converter 30. The analog signal is converted to an RF signal by an up-conversion module 40 consisting of a mixer and a filter, and it is inputted to a power amplifier 50 to be amplified.

The conventional pre-distortion method is carried out through two steps. First, the characteristic of the power amplifier 50 is produced, and then the pre-distortion function $A(.)$ is obtained on the basis of the characteristic of the power amplifier. To produce the characteristic of the power amplifier 50, the input and output signals of the power amplifier should be compared to each other. Accordingly, the output signal of the power amplifier 50 is fed back and inputted to a down-conversion module, consisting of a mixer and a filter, to be converted to an intermediate frequency (IF) signal. The IF signal is converted to a digital baseband signal $y_n$ by an A/D converter 80. The signals $X_n$ and $y_n$ are inputted to an amplifier characteristic producing module 25, and the characteristic function of the power amplifier 50 is produced on the basis of the signals $X_n$ and $Y_n$. A pre-distortion function decision module 15 determines the pre-distortion function $A(.)$ on the basis of the characteristic function of the power amplifier 50, which is produced by the amplifier characteristic producing module 25. The pre-distortion module 20 pre-distorts the input signal $u_n$ according to the pre-distortion function $A(.)$.

The aforementioned conventional pre-distortion system carries out the two steps of producing the characteristic function of the power amplifier 50 and of deciding the pre-distortion function on the basis of the characteristic function. Thus, hardware complexity of the pre-distortion system is increased and probability of linearization error in the pre-distortion system is also increased.

SUMMARY OF THE INVENTION

Accordingly, the present invention has been made in view of the above problems occurring in the conventional pre-distortion system, and it is the objective of the present invention to provide a power amplifying apparatus and method using pre-distortion, which produces the pre-distortion function through a single step, thereby reducing probability of linearization error and hardware complexity.

Another objective of the present invention is to provide a radio communication system including the power amplifying apparatus.

To accomplish the above objective, in an aspect of the present invention, there is provided a power amplifying apparatus using pre-distortion, including: a pre-distortion module for pre-distorting an input signal $x(n)$ according to a pre-distortion function, and for outputting a pre-distorted signal $z(n)$; a power amplifier for amplifying a signal obtained by digital-to-analog conversion of the pre-distorted signal $z(n)$; and a pre-distortion function producing module, which is for receiving the pre-distorted signal $z(n)$ and a signal $y(n)$ obtained by analog-to-digital conversion of the fed-back output signal of the power amplifier, and which also obtains model coefficients $c_{q,k,s}$ that minimize the power of a modeling error signal $e(n)=z(n)-y(n)$. Here, the pre-distortion function used by the pre-distortion module is represented as follows.

$$z(n) = \sum_{q=0}^{Q} \sum_{k=1}^{K} \sum_{s=-S}^{\min(S,q)} c_{q,k,s} y(n-q+s) |y(n-q)|^{k-1}$$

In another aspect of the present invention, also provided is a radio communication system including a power amplifying apparatus using pre-distortion, wherein the power amplifying apparatus includes a pre-distortion module for pre-distorting an input signal $x(n)$ according to a pre-distortion function, and for outputting a pre-distorted signal $z(n)$; a power amplifier for amplifying a signal obtained by digital-to-analog conversion of the pre-distorted signal $z(n)$; and a pre-distortion function producing module, which is for receiving the pre-distorted signal $z(n)$ and a signal $y(n)$ obtained by analog-to-digital conversion of the fed-back output signal of the power amplifier, and which also obtains model coefficients $c_{q,k,s}$ that minimize the power of a modeling error signal $e(n)=z(n)-y(n)$. Here, the pre-distortion function used by the pre-distortion module is represented as follows.

$$z(n) = \sum_{q=0}^{Q} \sum_{k=1}^{K} \sum_{s=-S}^{\min(S,q)} c_{q,k,s} y(n-q+s) |y(n-q)|^{k-1}$$

In another aspect of the present invention, also provided is a power amplifying method using pre-distortion, including: a pre-distortion step, which includes pre-distorting an input signal $x(n)$ according to a pre-distortion function, and which also outputs a pre-distorted signal $z(n)$; a power amplification step of amplifying a signal obtained by digital-to-analog conversion of the pre-distorted signal $z(n)$; and a pre-distortion function producing step, which includes receiving the pre-distorted signal z(n) and a signal y(n) obtained by analog-to-digital conversion of the fed-back output signal of the power amplifier, and which also obtains model coefficients $c_{q,k,s}$ that minimize the power of a modeling error signal $e(n)=z(n)-y(n)$. Here, the pre-distortion function used in the pre-distortion step is represented as follows.

$$z(n) = \sum_{q=0}^{Q} \sum_{k=1}^{K} \sum_{s=-S}^{min(S,q)} c_{q,k,s} y(n-q+s)|y(n-q)|^{k-1}$$

BRIEF DESCRIPTION OF THE DRAWINGS

The above and other objectives, features, and advantages of the present invention will be apparent from the following detailed description of the preferred embodiments of the invention in conjunction with the accompanying drawings, in which.

DETAILED DESCRIPTION OF THE PREFERRED EMBODIMENT

Reference will now be made in detail to the preferred embodiments of the present invention, examples of which are illustrated in the accompanying drawings.

Figure 1:
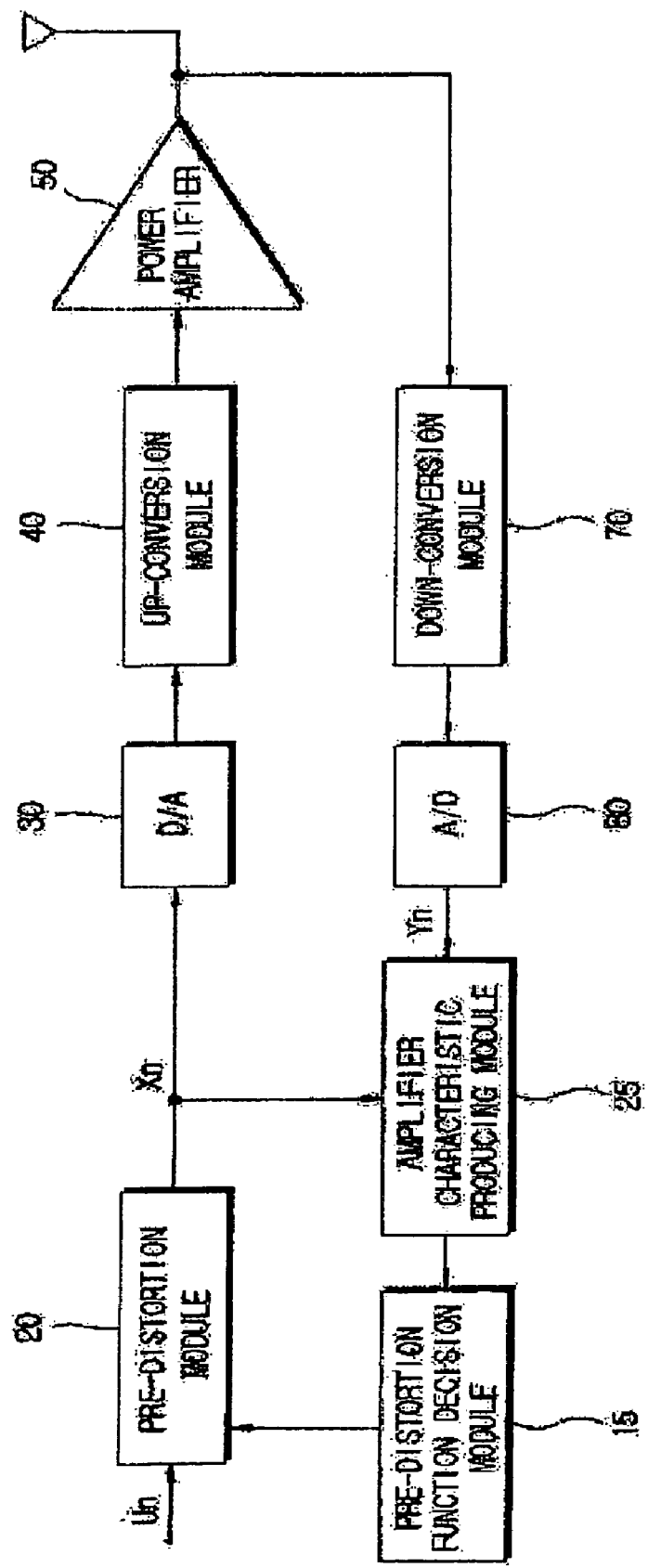
FIG. 1 is a block diagram of a conventional pre-distortion system.
Figure 2:
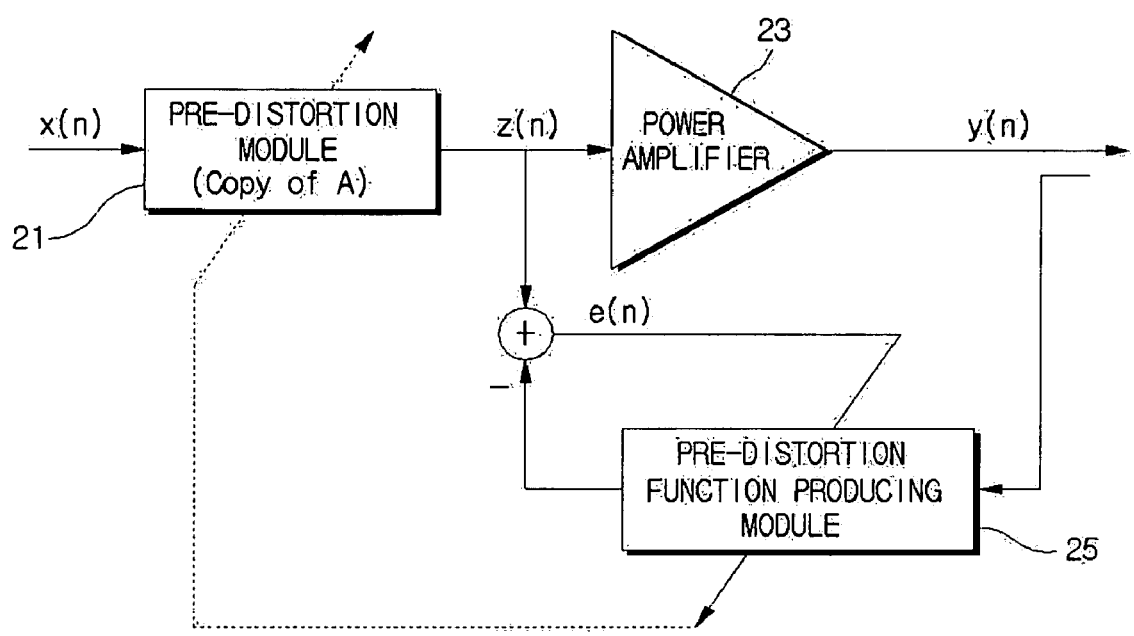
FIG. 2 is a block diagram for explaining the concept of the present invention.

FIG. 2 is a block diagram for explaining the concept of the present invention. In the configuration shown in FIG. 2, D/A conversion, A/D conversion, down-conversion and up-conversion of the pre-distortion process shown in FIG. 1 are omitted, and the pre-distortion process is carried out in a baseband region in order easily to convey the concept of the present invention to those skilled in the art.

Referring to FIG. 2, the present invention includes a pre-distortion module 21, a power amplifier 23, and a pre-distortion function producing module 25. The pre-distortion module 21 pre-distorts an input signal x(n) according to a pre-distortion function, and outputs a pre-distorted signal z(n). The power amplifier 23 amplifies the pre-distorted signal z(n) and outputs an amplified signal y(n). The pre-distortion function producing module 25 receives the pre-distorted signal z(n) and the amplified signal y(n) and produces the pre-distortion function.

The present invention is characterized by the fact that the pre-distortion function producing module 25 receives the input signal z(n) and the output signal y(n) of the power amplifier 23 and produces the pre-distortion function only using the signals z(n) and y(n) to provide the pre-distortion function to the pre-distortion module 21. Accordingly, the present invention obtains the pre-distortion function through a one-step process to reduce hardware complexity of the pre-distortion system. This is distinguished from the conventional pre-distortion system that obtains the pre-distortion function through two steps of attaining the characteristic function of the power amplifier and then converting the characteristic function to produce the pre-distortion function.

The pre-distortion function producing module 25 produces the pre-distortion function using the following polynomial expression.

$$z(n) = \sum_{q=0}^{Q} \sum_{k=1}^{K} \sum_{s=-S}^{min(S,q)} c_{q,k,s} y(n-q+s)|y(n-q)|^{k-1} \quad \text{[Expression 1]}$$

That is, the pre-distortion function producing module 25 obtains model coefficients $C_{q,k,s}$ that can represent the input signal z(n) of the power amplifier 23 using the current and previous output signals y(n) of the power amplifier 23.

Expression 1 is produced from the question of how a nonlinear function corresponding to the power amplifier characteristic is mathematically represented. Expression 1 uses the fact that the power amplifier distorts the power of an input signal non-linearly but does not change the phase of the input signal severely. Thus, Expression 1 represents that the power of the input signal is distorted according to a k-order function while the phase of the input signal is not changed. When the general polynomial concept is introduced in Expression 1 to calculate z(n) for various k values, the following polynomial expression capable of representing the simplest nonlinear characteristic can be obtained.

$$z(n) = \sum_{k=1}^{K} a_k y(n)|y(n)|^{k-1} \quad \text{[Expression 2]}$$

Here, the value of $a_k$ varies with a specific nonlinear function. Expression 2 represents the non-linear characteristic only using the current input signal y(n). Since some of the previous input signals also affect the current output value in the actual power amplifier, Expression 1 that is an extended form of Expression 2 is obtained considering both the current and previous input signal components.

Referring to Expression 1, terms that are related to input values of different time periods that affect the output value are considered. This is for the purpose of representing the pre-distortion function considering all of the various relationships among the input signals of respective time periods.

The number of terms of Expression 1 is decided depending on the values of Q, K and S in Expression 1. As the values of Q, K and S become larger, the function is modeled by considering a larger number of terms to improve accuracy. However, complexity of construction for realizing the function is also increased. Thus, a compromise between the number of terms and the hardware complexity is required.

The core of the problem of producing the pre-distortion function by the pre-distortion function producing module 25 is to obtain the polynomial model coefficients $c_{q,k,s}$ of Expression 1, which minimize a modeling error signal $e(n)=z(n)-y(n)$ shown in FIG. 2. The polynomial model coefficients $c_{q,k,s}$ can be obtained using the following expressions.

$$u_{qks}(n) = y(n-q+s)|y(n-q)|^{k-1} \quad \text{[Expression 3]}$$

$$z = [z(0), z(1), z(2), \ldots, z(N-1)]^T \quad \text{[Expression 4]}$$

$$u_{qks} = [u_{qks}(0), u_{qks}(1), \ldots, u_{qks}(N-1)]^T \quad \text{[Expression 5]}$$

$$U = [u_{01(-S)}, \ldots, u_{0K0}, \ldots, u_{Q1(-S)}, \ldots, u_{QKS}] \quad \text{[Expression 6]}$$

$$c = [c_{01(-S)}, \ldots, c_{0K0}, \ldots, c_{Q1(-S)}, \ldots, c_{QKS}] \quad \text{[Expression 7]}$$

$$c = (U^H U)^{-1} U^H z \quad \text{[Expression 8]}$$

Processes of obtaining Expressions 3 through 8 will now be explained.

When the current signal z(n) is obtained by using the output value at the point of time 0 and by using previous output values, z(0) is obtained from y(0), y(1), . . . , y(n−Q−S) according to Expression 1. Furthermore, z(1) at the point of time 1 is obtained from y(1), y(0), y(−1), . . . , y(1−Q−S). Similarly, z(n) is obtained from y(n), y(n−1), . . . , y(n−Q−S), and z(N) is obtained from y(N), y(N−1), . . . , y(N−Q−S).

Accordingly, algorithms of Expression 3 through 8 are obtained by making simple determinants using a procedure of finding out common terms from the relationship of the output values. A method of producing the model coefficients $c_{q,k,s}$ according to the algorithms represented by Expressions 3 through 8 can be easily obtained by the least-squares method generally used in the art.

Figure 3:
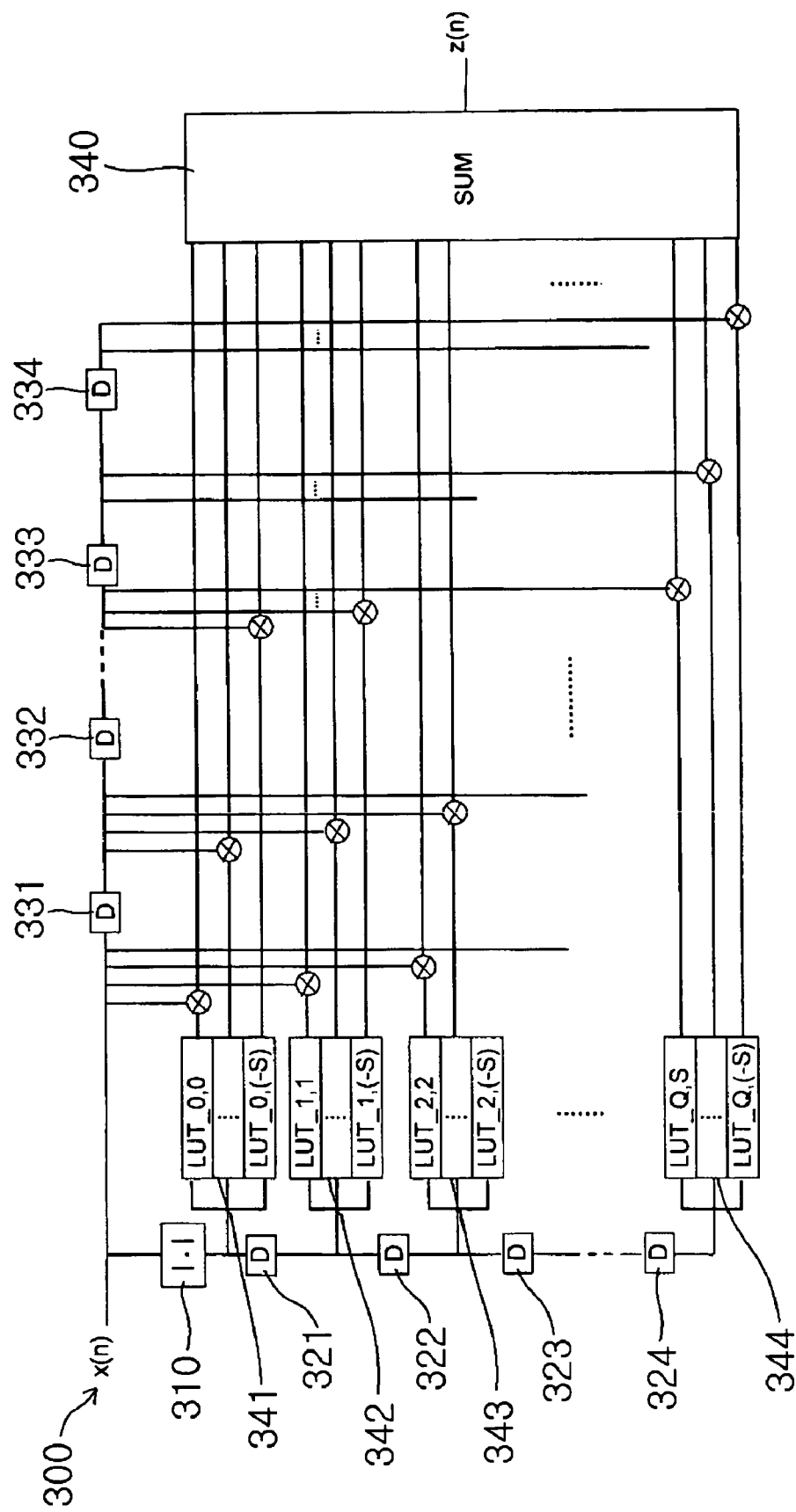
FIG. 3 is a block diagram of a pre-distortion module of a power amplifying apparatus according to the present invention.

FIG. 3 is a block diagram of the pre-distortion module 21 of FIG. 2. The pre-distortion module 21, which outputs the pre-distorted signal z(n), receives the model coefficients $c_{q,k,s}$ produced by the pre-distortion function producing module 25 and pre-distorts the input signal x(n) based on the pre-distortion function represented by the following expression. FIG. 3 shows the construction required for carrying out this process.

$$z(n) = \sum_{q=0}^{Q} \sum_{k=1}^{K} \sum_{s=-S}^{\min(S,q)} c_{q,k,s} x(n-q+s)|x(n-q)|^{k-1} \quad \text{[Expression 9]}$$

In comparing Expression 1 with Expression 9, it can be seen that there is symmetry between them. This symmetry can be understood because it is preferable that the output signal y(n) of the power amplifier 23 of the pre-distortion system shown in FIG. 2 becomes identical to the input signal x(n).

In FIG. 3, LUT_0,0, LUT_0,(−S), LUT_1,1, LUT_1, (−S), LUT_2,2, LUT_2,(−), . . . , LUT_Q,S, . . . , LUT_Q, (−S) 341, 342, 343 and 344 are look-up tables formed by previously calculating values of $$\sum_{k=1}^{K} c_{q,k,s} |x(n-q)|^{k-1}$$

for all |x(n−q)| for q and s. The number of values of the variable q is Q+1 and the maximum number of values of the variable s is 2K+1. Thus, (Q+1)(2K+1) look-up tables are generated.

Referring to FIG. 3, when the input signal x(n) is inputted, the current and previous signal values are stored by delay chains 331, 332, 333 and 334, and the absolute values 310 of the signal values are stored in other delay chains 321, 322, 323 and 324. Then, the pre-distortion module 21 finds LUT values corresponding to x(n−q+s) for q, k and s and multiplies the signal values and absolute values by the LUT values. The multiplied values are summed by an adder 340 that carries out a calculation corresponding to $$\sum_{q=0}^{Q} \sum_{s=-S}^{\min(S,q)},$$

and that outputs the pre-distorted signal z(n).

While the power amplifying apparatus using pre-distortion has been explained in the above-described embodiment, the concept of the present invention can be applied to a power amplifying method using pre-distortion in the same manner. It is apparent to those skilled in the art that the power amplifying apparatus using pre-distortion according to the present invention can be applied to a radio communication system including CDMA.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

According to the power amplifying apparatus and method using pre-distortion and the radio communication system including the apparatus of the present invention, the number of steps of producing the pre-distortion function is reduced, compared to the conventional pre-distortion function producing process, so that probability of linearization error is decreased. Furthermore, the present invention uses a mathematical non-linear model capable of improving the performance of the power amplifier while minimizing its hardware complexity. Moreover, the present invention can simplify hardware for realizing the power amplifying apparatus using look-up tables.

What is claimed is:

1. A power amplifying apparatus using pre-distortion, comprising:

a pre-distortion module for pre-distorting an input signal x(n) according to a pre-distortion function, and for outputting a predistorted signal z(n), a power amplifier for amplifying a signal obtained by digital-to-analog conversion of the pre-distorted signal z(n), and a pre-distortion function producing module for receiving the pre-distorted signal z(n) and a signal y(n) obtained by analog-to-digital conversion of the fed-back output signal of the power amplifier, and for obtaining model coefficients $c_{q,k,s}$ that minimize the power of a modeling error signal e(n)=z(n)−y(n), said pre-distortion function used by the pre-distortion module represented as, $$z(n) = \sum_{q=0}^{Q} \sum_{k=1}^{K} \sum_{s=-S}^{\min(S,q)} c_{q,k,s} y(n-q+s)|y(n-q)|^{k-1}$$

wherein, Q is a maximum number of memory depth in an actual implementation, K is a maximum order of nonlinear polynomial to be implemented in the pre-distortion system, S is a maximum memory depth of cross-memory terms to be considered in the pre-distortion implementation, q is an indexing variable for summation operation over memory from 0 up to Q, k is an indexing variable for summation operation over polynomial order from 1 up to K, s is an indexing variable for summation operation over cross-memory depth from −S up to min(S, q) and $c_{q,k,s}$ is a model coefficient corresponding to the specific values of q, k and s.

2. The power amplifying apparatus as claimed in claim 1, wherein the pre-distortion module pre-distorts the input signal according to the pre-distortion function in such a manner that values of $$\sum_{k=1}^{K} c_{q,k,s}|x(n-q)|^{k-1}$$

are previously calculated for all |x(n−q)| for q and s to form look-up tables (LUT), wherein delay chains store current and previous signal values upon the input of the input signal x(n), and other delay chains store the absolute values of the signal values, wherein LUT values corresponding to x(n−q+s) for q, k and s are found and multiplied by the signal values and absolute values, and wherein the multiplied values are summed by an adder that carries out a calculation corresponding to $$\sum_{q=0}^{Q} \sum_{s=-S}^{\min(S,q)} .$$

3. A radio communication system including a power amplifying apparatus using pre-distortion, the power amplifying apparatus comprises:
   a pre-distortion module for pre-distorting an input signal x(n) according to a pre-distortion function, and for outputting a pre-distorted signal z(n),
   a power amplifier for amplifying a signal obtained by digital-to-analog conversion of the pre-distorted signal z(n), and
   a pre-distortion function producing module for receiving the pre-distorted signal z(n) and a signal y(n) obtained by analog-to-digital conversion of the fed-back output signal of the power amplifier, and for obtaining model coefficients $c_{q,k,s}$ that minimize the power of a modeling error signal e(n)=z(n)−y(n), said pre-distortion function used by the pre-distortion module represented as, $$z(n) = \sum_{q=0}^{Q} \sum_{k=1}^{K} \sum_{s=-S}^{\min(S,q)} c_{q,k,s} y(n-q+s)|y(n-q)|^{k-1}$$

wherein, Q is a maximum number of memory depth in an actual implementation, K is a maximum order of nonlinear polynomial to be implemented in the pre-distortion system, S is a maximum memory depth of cross-memory terms to be considered in the pre-distortion implementation. q is an indexing variable for summation operation over memory from 0 up to Q, k is an indexing variable for summation operation over polynomial order from 1 up to K, s is an indexing variable for summation operation over cross-memory depth from −S up to min(S, q) and $c_{q,k,s}$ is a model coefficient corresponding to the specific values of q, k and s.

4. The radio communication system as claimed in claim 3, wherein the pre-distortion module pre-distorts the input signal according to the pre-distortion function in such a manner that values of $$\sum_{k=1}^{K} c_{q,k,s}|x(n-q)|^{k-1}$$

are previously calculated for all |x(n−q)| to form look-up tables (LUT), wherein delay chains store current and previous signal values upon the input of the input signal x(n), and other delay chains store the absolute values of the signal values, wherein LUT values corresponding to x(n−q+s) for q, k and s are found and multiplied by the signal values and absolute values, and wherein the multiplied values are summed by an adder that carries out a calculation corresponding $$\sum_{q=0}^{Q} \sum_{s=-S}^{\min(S,q)} .$$

5. A power amplifying method using pre-distortion, comprising:
   a pre-distortion step of pre-distorting an input signal x(n) according to a pre-distortion function, and of outputting a pre-distorted signal z(n),
   a power amplification step of amplifying a signal obtained by digital-to-analog conversion of the pre-distorted signal z(n), and
   a pre-distortion function producing step of receiving the pre-distorted signal z(n) and a signal y(n) obtained by analog-to-digital conversion of the fed-back output signal of the power amplifier, and of obtaining model coefficients $c_{q,k,s}$ that minimize the power of a modeling error signal e(n)=z(n)−y(n), said pre-distortion function used in the pre-distortion step represented as, $$z(n) = \sum_{q=0}^{Q} \sum_{k=1}^{K} \sum_{s=-S}^{\min(S,q)} c_{q,k,s} y(n-q+s)|y(n-q)|^{k-1}$$

wherein, Q is a maximum number of memory depth in an actual implementation, K is a maximum order of nonlinear polynomial to be implemented in the pre-distortion system, S is a maximum memory depth of cross-memory terms to be considered in the pre-distortion implementation, q is an indexing variable for summation operation over memory from 0 up to Q, k is an indexing variable for summation operation over polynomial order from 1 up to K, s is an indexing variable for summation operation over cross-memory depth from −S up to min(S, q) and $c_{q,k,s}$ is a model coefficient corresponding to the specific values of q, k and s.

6. The power amplifying method as claimed in claim 5, wherein the input signal is pre-distorted according to the pre-distortion function in such a manner that values of $$\sum_{k=1}^{K} c_{q,k,s}|x(n-q)|^{k-1}$$

are previously calculated for all |x(n−q)| for q and s to form look-up tables (LUT), wherein delay chains store current and previous signal values upon the input of the input signal x(n), and other delay chains store the absolute values of the signal values, wherein LUT values corresponding to x(n−q+s) for q, k and s are found and multiplied by the signal values and absolute values, and wherein the multiplied values are summed by an adder that carries out a calculation corresponding to $$\sum_{q=0}^{Q} \sum_{s=-S}^{\min(S,q)} .$$

* * * * *